United States Patent
Takazawa et al.

(10) Patent No.: US 6,724,020 B2
(45) Date of Patent: Apr. 20, 2004

(54) SEMICONDUCTOR DEVICE AND POWER AMPLIFIER USING THE SAME

(75) Inventors: Hiroyuki Takazawa, Hino (JP); Tohru Oka, Kokubunji (JP); Isao Ohbu, Sagamihara (JP); Yoshinori Imamura, Sagamiko (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/420,764

(22) Filed: Apr. 23, 2003

(65) Prior Publication Data
US 2003/0205719 A1 Nov. 6, 2003

Related U.S. Application Data

(63) Continuation of application No. 09/863,343, filed on May 24, 2001, now Pat. No. 6,576,937.

(30) Foreign Application Priority Data

Jun. 1, 2000 (JP) ........................................ 2000-169050

(51) Int. Cl.[7] .............................................. H01L 31/109
(52) U.S. Cl. ...................... 257/201; 257/115; 257/198; 257/523; 257/616; 257/347; 257/197
(58) Field of Search ................................. 257/115, 198, 257/197, 523, 616, 347, 201

(56) References Cited

U.S. PATENT DOCUMENTS

| | | |
|---|---|---|
| 4,731,340 A | 3/1988 | Chang et al. |
| 4,800,415 A | 1/1989 | Simmons et al. |
| 4,996,165 A | 2/1991 | Chang et al. |
| 5,185,274 A | 2/1993 | Chang et al. |
| 5,682,046 A | 10/1997 | Takahashi et al. |
| 5,780,922 A | 7/1998 | Mishra et al. |
| 5,837,589 A | 11/1998 | McNamara et al. |
| 5,907,165 A | 5/1999 | Hamm et al. |
| 6,043,520 A | 3/2000 | Yamamoto et al. |
| 6,392,258 B1 | 5/2002 | Hirata et al. |

FOREIGN PATENT DOCUMENTS

JP          07-106343          7/1994

OTHER PUBLICATIONS

Yutaka Kamei, Makoto Baba and Shigetaka Fujita, "space Charge in Polyimide Film after Water Absorption", Proceedings of the 6th International Conference on Properties and Applications of Dielectric Materials (Jun. 21–26, 2000).

*Primary Examiner*—Richard Elms
*Assistant Examiner*—Doug Menz
(74) *Attorney, Agent, or Firm*—Reed Smith LLP; Stanley P. Fisher, Esq.; Juan Carlos A. Marquez, Esq.

(57) ABSTRACT

A semiconductor device comprising a bipolar transistor having an emitter layer consisting of a semiconductor containing indium, and a protective insulating film containing silicon and oxygen which is formed on the surface of the guard ring of the emitter layer, wherein the protective insulating film has a density of oxygen of less than $7\times10^{22}$ $cm^{-3}$. This semiconductor device prevents performance deterioration and ensures high performance in a power amplifier.

6 Claims, 8 Drawing Sheets

SEMICONDUCTOR DEVICE AND POWER AMPLIFIER USING THE SAME

This application is a continuation application of U.S. application Ser. No. 09/863,343 filed on May 24, 2001 now U.S. Pat. No. 6,576,937.

BACKGROUND OF THE INVENTION

The present invention relates to a semiconductor device and a power amplifier using the same.

In recent years, with the rapid growth in demand for mobile communication equipment, research and development of compound semiconductor devices for power amplifiers used in mobile communication equipment has been actively conducted. As one of such compound semiconductor devices, a hetero junction bipolar transistor (hereinafter called "HBT") which has a high current drivability has been used.

AlGaAs has been widely used as a material for HBT emitter layers. However, there is an increasing trend to develop HBTs which use InGaP instead of AlGaAs because the former is more reliable in use over a long period that the latter. An example of an HBT which uses an InGaP emitter layer has been disclosed, for example, in Japanese Patent Laid-Open Publication No. 07-106343.

Figure 15:
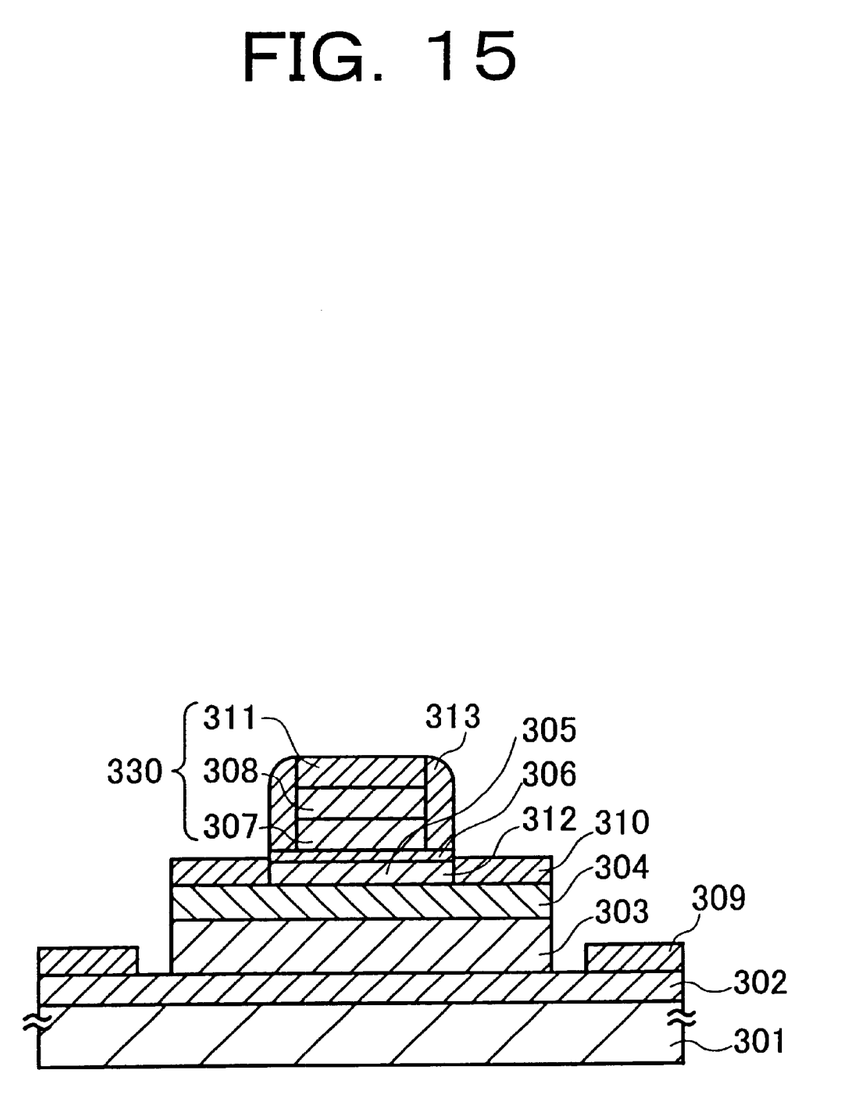
FIG. 15 is a sectional view illustrating a conventional semiconductor device.

This prior art is illustrated in FIG. 15. An n-type GaAs emitter protective layer 306 is formed on an n-type InGaP emitter layer 305; an $SiO_2$ side wall 313 is formed on the area of the n-type GaAs emitter protective layer 306 which corresponds to the guard ring 312 of the n-type InGaP emitter layer 305. The n-type GaAs emitter protective layer 306 prevents direct contact between the n-type InGaP emitter layer 305 and the $SiO_2$ side wall 313, thereby avoiding an increase in a leakage current.

SUMMARY OF THE INVENTION

The present invention has an object to provide a semiconductor device in which, in a bipolar transistor having an emitter layer consisting of a semiconductor containing indium, a GaAs emitter protective layer is not used as a protective layer for preventing an increase in a leakage current between the emitter and base, and also provide a power amplifier using the same.

The above-said object can be achieved by covering the emitter layer guard ring surface of the bipolar transistor having an emitter layer consisting of a semiconductor containing indium, with a protective insulating film which contains silicon (Si) and oxygen (O) and has a density of oxygen of less than $7 \times 10^{22}$ $cm^{-3}$.

It is also acceptable that the density of oxygen of the protective insulating film is $3 \times 10^{22}$ $cm^{-3}$ is or less, or $8 \times 10^{21}$ $cm^{-3}$ or less.

Also, the protective insulating film may further contain nitrogen (N) or hydrogen (H) as well.

BRIEF DESCRIPTION OF THE DRAWINGS

Preferred embodiments of the present invention will be described in detail based on the followings, wherein.

DESCRIPTION OF THE PREFERRED EMBODIMENTS

Figure 1:
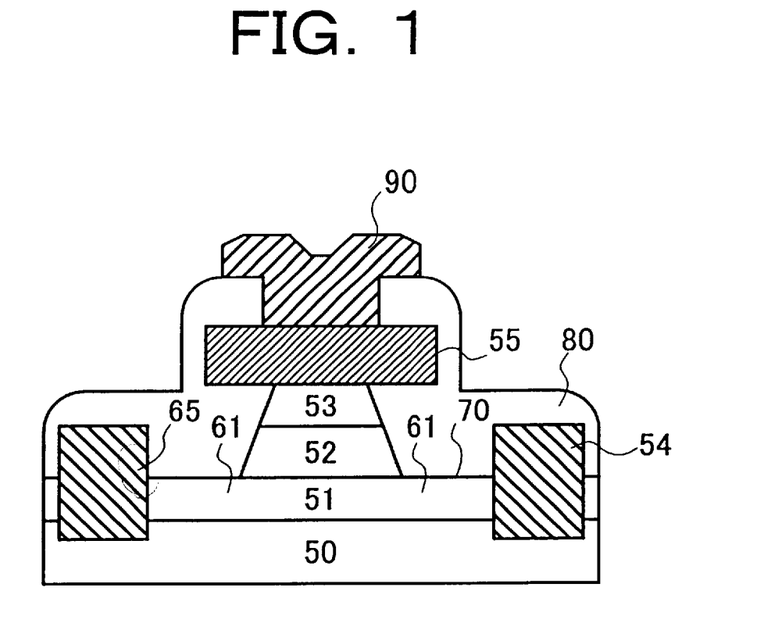
FIG. 1 is a sectional view illustrating a semiconductor device according to the present invention.

FIG. 1 is a sectional view illustrating an HBT which uses InGaP as an emitter layer material. In the figure, reference numeral 50 represents a GaAs base layer; 51 an InGaP emitter layer; 52 a GaAs ballast layer; 53 an InGaAs emitter contact layer; 54 a base electrode; 55 an emitter electrode; 80 a protective insulating film; and 90 an emitter wiring. The collector layer, the sub-collector layer and the collector electrode in the HBT are omitted in FIG. 1 for simpler illustration. The base electrode 54 contacts the base layer 50 due to diffusion of its material into the emitter layer 51 so as to make an Ohmic contact. Although the base electrode 54 contacts the emitter layer 51, it is not necessary to take into consideration the electric current path from the base electrode 54 through the emitter layer 51, the ballast layer 52 and the emitter contact layer 53 to the emitter electrode 55. This is because the region (guard ring) 61, which does not form a junction with the ballast layer 52, of the InGaP emitter layer 51 is depleted and has a high resistance, and also because the interface 65 between the guard ring 61 and the base electrode 54 is a Schottky junction and has a high resistance. The surface 70 of the guard ring 61 is covered with a protective insulating film 80 to prevent progress in natural oxidation and any etchant infiltration failure in the manufacturing process.

Figure 11:
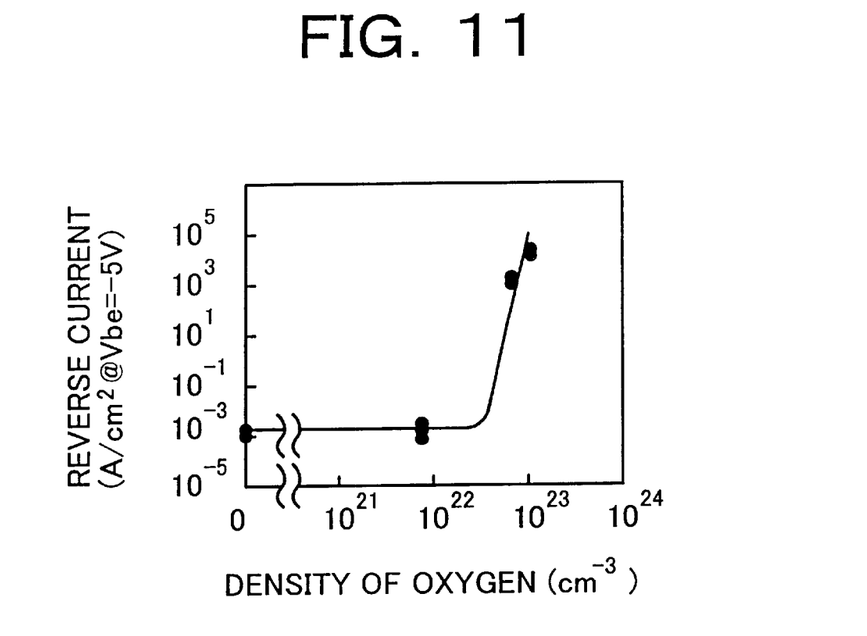
FIG. 11 is a graph of reverse current against the density of oxygen in the protective insulating film.
Figure 12:
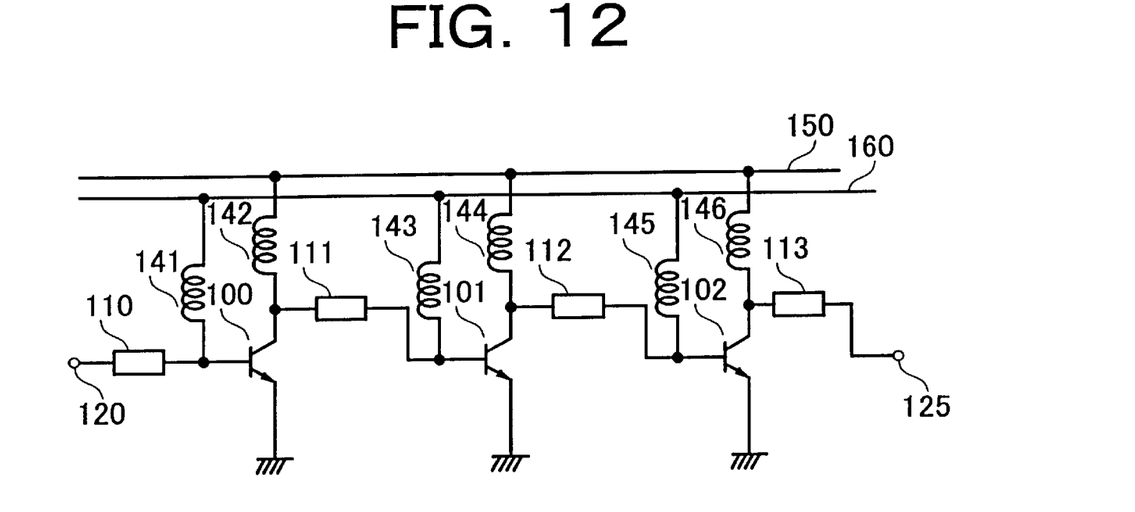
FIG. 12 is a circuit diagram for a power amplifier.

FIG. 12 shows an example of a power amplifier for mobile communication equipment which has, as basic elements, HBTs using InGaP as an emitter layer material. In this power amplifier, a signal inputted through a signal input terminal 120 is sequentially amplified by HBTs 100, 101 and 102 connected through matching networks 110, 111, 112 and 113 before being outputted from a signal output terminal 125. In this figure, reference numerals 141 to 146 represent choke inductors, 150 a collector wiring and 160 a base wiring.

of oxygen: −0, $8\times10^{21}$, $7\times10^{22}$ and $1\times10^{23}$ cm$^{-3}$. These protective insulating film forming conditions are summarized in Table 1.

TABLE 1

|  | Forming Condition 1 | Forming Condition 2 | Forming Condition 3 | Forming Condition 4 |
|---|---|---|---|---|
| Density of oxygen | −0 | $8\times10^{21}$ cm$^{-3}$ | $7\times10^{22}$ cm$^{-3}$ | $1\times10^{23}$ cm$^{-3}$ |
| Reverse Current (Vbe = 5 V) | $-10^{-3}$ A/cm$^2$ | $-10^{-3}$ A/cm$^2$ | $10^3$ A/cm$^2$ | $10^4$ A/cm$^2$ |
| Gas used (flow rate) | (1) 4% SiH$_4$ (diluted with N$_2$; 500 sccm) (2) NH$_3$ (30 sccm) | (1) 4% SiH$_4$ (diluted with N$_2$; 450 sccm) (2) N$_2$O (200 sccm) | (1) 5% SiH$_4$ (diluted with He; 100 sccm) (2) N$_2$O (220 sccm) | (1) 4% SiH$_4$ (diluted with N$_2$; 500 sccm) (2) O$_2$ (3500 sccm) (3) N$_2$ (2000 sccm) |
| Degree of vacuum | 49 Pa | 49 Pa | 40 Pa | Atmospheric Pressure |
| Substrate Temperature | 250° C. | 250° C. | 250° C. | 390° C. |
| Supply Energy | RF power 150 W | RF power 150 W | RF power 50 W | Heat |

When the power amplifier as shown in FIG. 12 was incorporated in a 1-GHz class system such as a GSM (Global System for Mobile Communication) and operated at a high power (several watts), its amplification factor gradually decreased.

Figure 13:
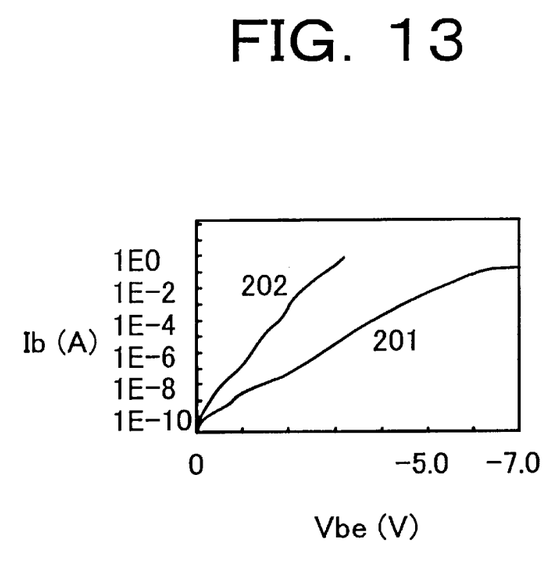
FIG. 13 is a graph of a reverse current Ib against the reverse voltage Vbe in the insulating film formed under forming condition 4 shown in Table 1.

In order to find the cause of this problem, the DC characteristics of the HBTs used in the power amplifier were investigated. It has been found that the amplification factors for HBTs 100, 101 and 102 decreased and, among them, the final stage HBT 102 showed a particularly remarkable decrease in amplification factor. Further, an examination of DC characteristics between terminals in the final stage HBT 102 has revealed that regarding the characteristics of the reverse current between the emitter and base, the emitter-base leakage current after amplification factor decrease (characteristic curve 202) is larger than that before amplification factor decrease (characteristic curve 201) as shown in FIG. 13.

Then, in order to find the cause of the increase in leakage current between the emitter and the base, an investigation was also made as to how the reverse current between the emitter and base (per square centimeter emitter area) changes as the density of oxygen in the protective insulating film 80 is varied. Here, −5V was applied as the reverse voltage.

The density of oxygen in the protective insulating film was calculated from its constituent element atomic ratio and atomic density measured by the RBS (Rutherford Back Scattering) and HFS (Hydrogen Forward Scattering) methods. Supposing that the constituent elements of the protective insulating film are Si, O, N, and H (ingredients of the film material) and its composition is Si$_l$O$_p$N$_q$H$_r$, constituent element atomic ratio l, p, q, r, as well as constituent element atomic density $n_{all}$ can be calculated. $n_{all}$ represents a total number of Si, O, N and H atoms contained per cubic centimeter. The density of oxygen $n_o$ can be obtained from the equation $n_o = n_{all} \times p/(l+p+q+r)$.

FIG. 11 shows the result of the investigation: if the density of oxygen is in the range from 0 to $3\times10^{22}$ cm$^{-3}$, when −5V reverse voltage is applied, the reverse current is almost constant ($10^{-3}$ A/cm$^2$ or so). If the density of oxygen is larger than that, the reverse current sharply increases. FIG. 11 is a graph in which current values are plotted for densities Under the forming condition 1, a trace of oxygen actually remains in the insulating film forming device though no compound gas (which generates oxygen) is introduced as a material into the device.

When the protective insulating film forming condition 1 or 2 in Table 1 was used, the reverse current as shown in FIG. 11 was $10^{-3}$ A/cm$^2$ or so, which demonstrates an improvement, or a decrease by 7 digits, as compared with the case in which the forming condition 4 was used. Even when forming condition 3 (plasma chemical vapor deposition) was used, the reverse current was $10^3$ A/cm$^2$, which is smaller than $10^4$ A/cm$^2$ in the case of the forming condition 4 (thermal chemical vapor deposition).

Figure 14:
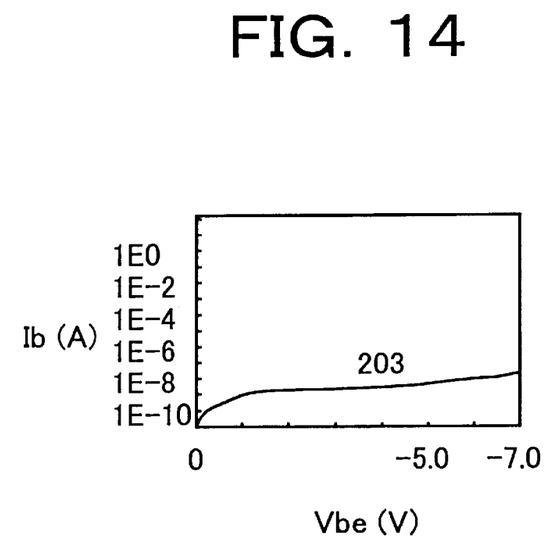
FIG. 14 is a graph of reverse current Ib against the reverse voltage Vbe in the insulating film formed under forming condition 2 shown in Table 1.

When HBTs which have an insulating film (made under the forming condition 2) were used for HBTs 100, 101 and 102 as shown in FIG. 12, no current amplification factor deterioration was observed. The initial DC characteristic of the reverse current between the emitter and base is shown as a characteristic curve in FIG. 14. This characteristic remained almost unchanged even after operation at high power (several watts). The reason for this may be that, since the protective insulating film used has a low density of oxygen ($3\times10^{22}$ cm$^{-3}$ or less), generation of much indium oxide did not occur on the surface of the InGaP emitter layer and thus the initial reverse current was small and with no current leakage path proliferation.

Embodiment 1

Figure 10:
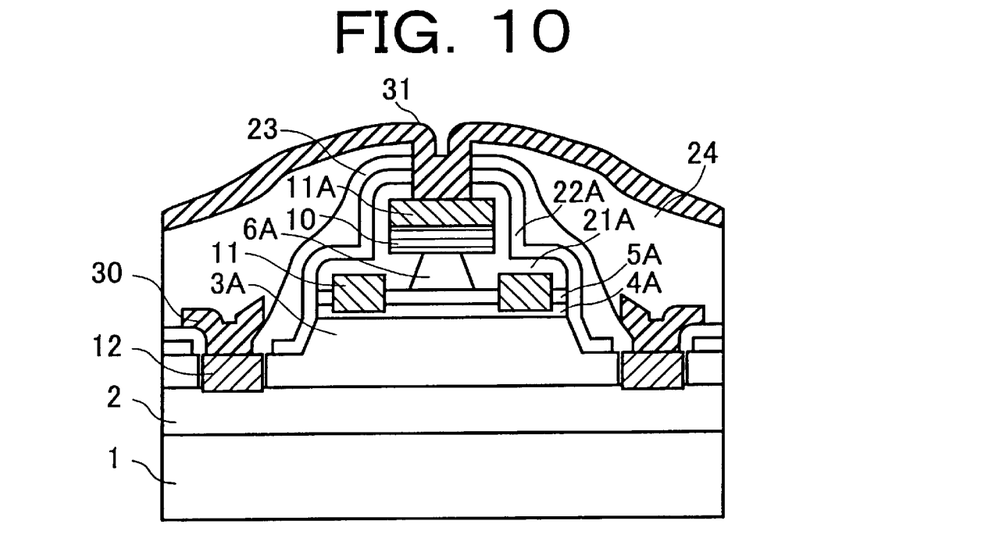
FIG. 10 is a sectional view of an embodiment of a semiconductor device according to the present invention.

A semiconductor device according to one embodiment of the present invention is explained below referring to FIG. 10. Here, an HBT consists of the following layers formed on the main side surface of a semi-insulating GaAs substrate 1 one upon another in order: n type GaAs sub-collector layer 2A (thickness: 600 nm; dopant: silicon; impurity concentration: $5\times10^{18}$ cm$^{-3}$); n type GaAs collector layer 3A (thickness: 800 nm; dopant: silicon; impurity concentration: $1\times10^{16}$ cm$^{-3}$) p type GaAs base layer 4A (thickness: 70 nm; dopant: carbon; impurity concentration: $3\times10^{19}$ cm$^{-3}$); n type In$_x$Ga$_{1-x}$P emitter layer 5A (x: 0.5; thickness: 30 nm; dopant: silicon; impurity concentration: $3\times10^{17}$ cm$^{-3}$); n type In$_y$Ga$_{1-y}$As emitter contact layer 6A (y: 0 around the junction with the n type In$_x$Ga$_{1-x}$P emitter layer 5A, 0.5 around the area adjacent to the emitter electrode 10; thickness: 400 nm; dopant: silicon; impurity concentration: $3\times10^{17}$ cm$^{-3}$ around the junction with the n type In$_x$Ga$_{1-x}$P emitter layer 5A, $5 \times 10^{18}$ cm$^{-3}$ around the area adjacent to the emitter electrode 10); first emitter electrode 10 and second emitter electrode 11A; base electrode 11; and collector electrode 12. 21A denotes a protective insulating film (made under forming condition 2 as shown in Table 1) with a density of oxygen of $8 \times 10^{21}$ cm$^{-3}$ which protects the main side surface of the emitter layer 5A. 22A denotes an insulating film which protects the junction between the emitter layer 5A and base layer 4A and the surface of the collector layer 3A. 23 represents an insulating film including an insulator coating (SOG) made to prevent defects such as discontinuity and short-circuits in making collector wiring 30 and base wiring, while 24 represents an insulating film including an SOG made to prevent defects such as discontinuity and short-circuits in making emitter wiring 31. Here, the base wiring, which forms an electrical junction with the base electrode 11 in a cross section other than that shown in FIG. 10, is not shown in the figure.

Figure 2:
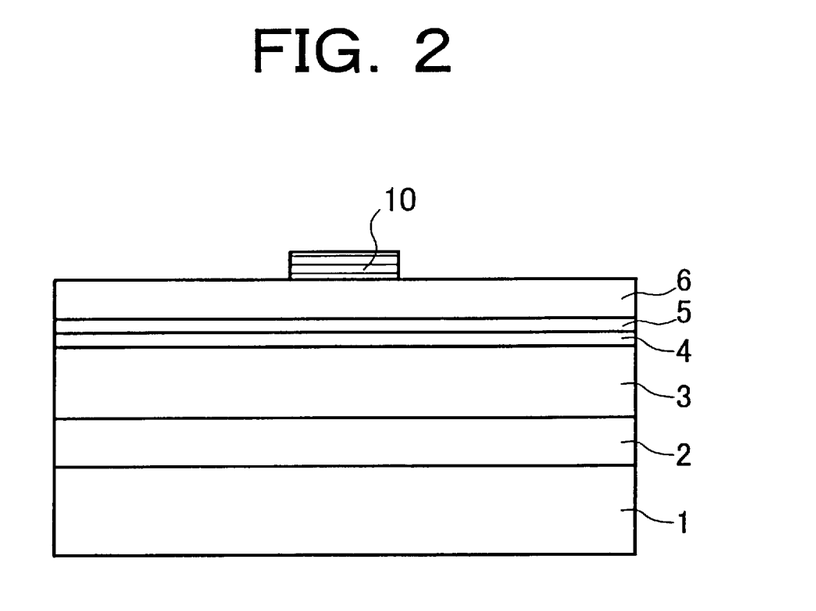
FIG. 2 is a sectional view illustrating the manufacturing method for an embodiment of a semiconductor device according to the present invention.

The method for manufacturing this semiconductor device is explained below by reference to FIGS. 2 to 9. First, an epitaxial film is formed on the main side surface of a semi-insulating GaAs substrate 1 by placing the following layers one upon another in the order of mention using the MOCVD method: n type GaAs sub-collector layer 2 (thickness: 600 nm; dopant: silicon; impurity concentration: $5 \times 10^{18}$ cm$^{-3}$); n type GaAs collector layer 3 (thickness: 800 nm; dopant; silicon; impurity concentration: $1 \times 10^{16}$ cm$^{-3}$); p type GaAs base layer 4 (thickness: 70 nm; dopant: carbon; impurity concentration: $3 \times 10^{19}$ cm$^{-3}$); n type In$_x$Ga$_{1-x}$P emitter layer 5 (x: 0.5; thickness: 30 nm; dopant: silicon; impurity concentration: $3 \times 10^{17}$ cm$^{-3}$); n type In$_y$Ga$_{1-y}$As emitter contact layer 6 (y: 0 around the junction with the n type In$_x$Ga$_{1-x}$P layer 5, 0.5 around the area adjacent to the emitter electrode 10; thickness: 400 nm; dopant: silicon; impurity concentration: $3 \times 10^{17}$ cm$^{-3}$ around the junction with the n type In$_x$Ga$_{1-x}$P layer 5, $5 \times 10^{18}$ cm$^{-3}$ around the area adjacent to the emitter electrode 10). Then, as shown in FIG. 2, WSi$_z$ (z: approx. 0.3; thickness: 300 nm) is formed by sputtering and then patterning is done by photolithography, followed by plasma etching to make a first layer emitter electrode 10.

Figure 3:
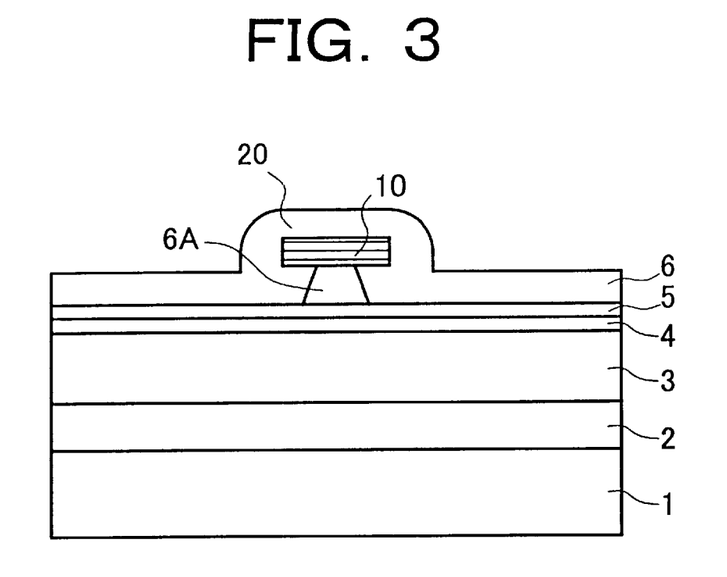
FIG. 3 is a sectional view illustrating the manufacturing method for an embodiment of a semiconductor device according to the present invention.

Then, as shown in FIG. 3, using the first layer emitter electrode 10 as a mask, then n type In$_y$Ga$_{1-y}$As layer 6 is etched with phosphoric acid etching solution (H$_3$PO$_4$ (85 weight %): H$_2$O$_2$ (30 weight %): H$_2$O=1:2:40) to make it an emitter contact layer 6A, followed by forming an insulating film 20 all over by the thermal CVD method. The forming condition of the thermal CVD method used for forming the insulating film 20 is as follows: three types of gas are used (4% SiH$_4$ diluted with N$_2$, and O$_2$ and N$_2$ and their flow rates are 500 sccm, 3,500 sccm and 2,000 sccm, respectively); atmospheric pressure and 390° C. substrate temperature.

Figure 4:
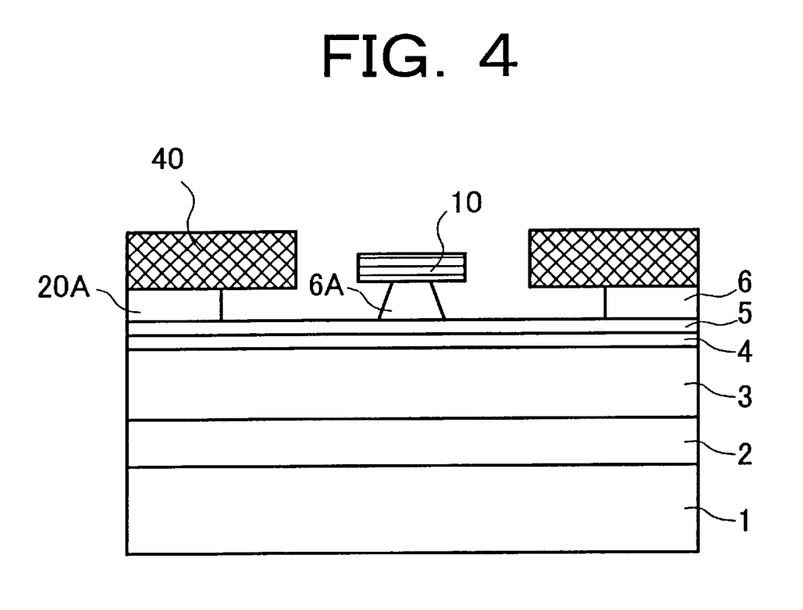
FIG. 4 is a sectional view illustrating the manufacturing method for an embodiment of a semiconductor device according to the present invention.

Then, a resist pattern 40 is made by photolithography and the insulating film 20 is processed by plasma etching with a hydrofluoric acid solution to make it 20A, as shown in FIG. 4.

Figure 5:
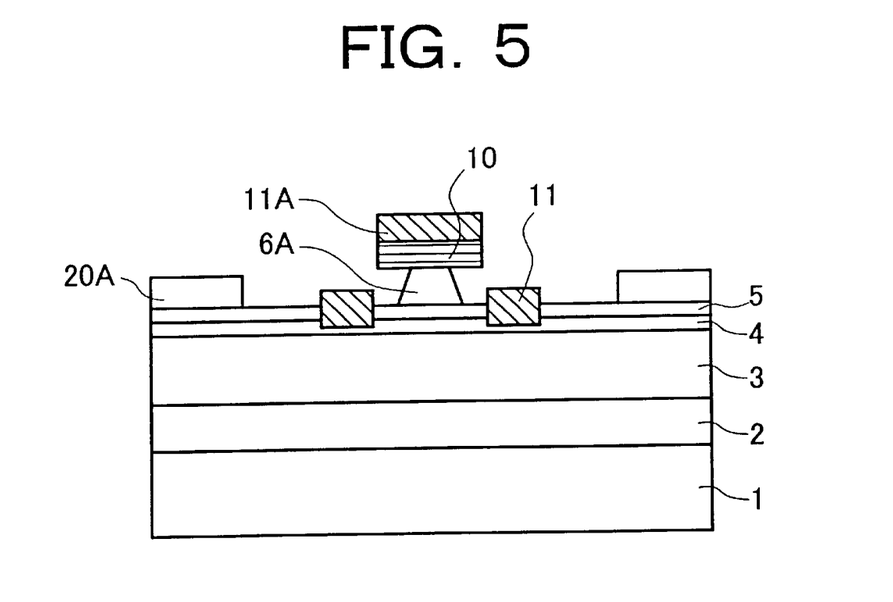
FIG. 5 is a sectional view illustrating the manufacturing method for an embodiment of a semiconductor device according to the present invention.

Next, Pt (20 nm), Ti (10 nm), Mo (30 nm), Ti (50 nm), Pt (50 nm), and Au (120 nm) are deposited one upon another in the order of mention by evaporation before forming a base electrode 11 using the lift-off method. An Ohmic contact between the base layer 4 and the base electrode 11 is made by a thermal sintering process based at a later process. The base electrode 11 is formed on the first layer emitter electrode 10 by self-alignment, so also formed on the emitter electrode 10 is a second layer emitter electrode 11A which consists of Pt, Ti, Mo, Ti, Pt and Au deposited one upon another in the order of mention (FIG. 5).

Figure 6:
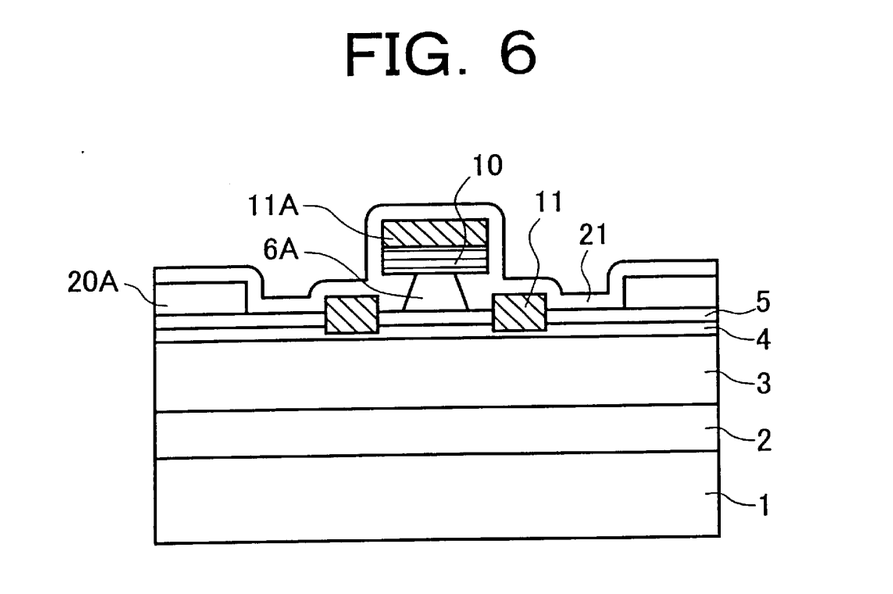
FIG. 6 is a sectional view illustrating the manufacturing method for an embodiment of a semiconductor device according to the present invention.

Then, a protective insulating film 21 which protects the surface of the n type In$_x$Ga$_{1-x}$P emitter layer 5 is formed all over using the plasma CVD method under forming condition 2 in Table 1 (two types of gas, 4% SiH$_4$ diluted with N$_2$ and N$_2$O whose flow rates are 450 sccm and 200 sccm, respectively, are used; degree of vacuum 49 Pa; substrate temperature 250° C.; supply energy RF power 150W) (FIG. 6).

Figure 7:
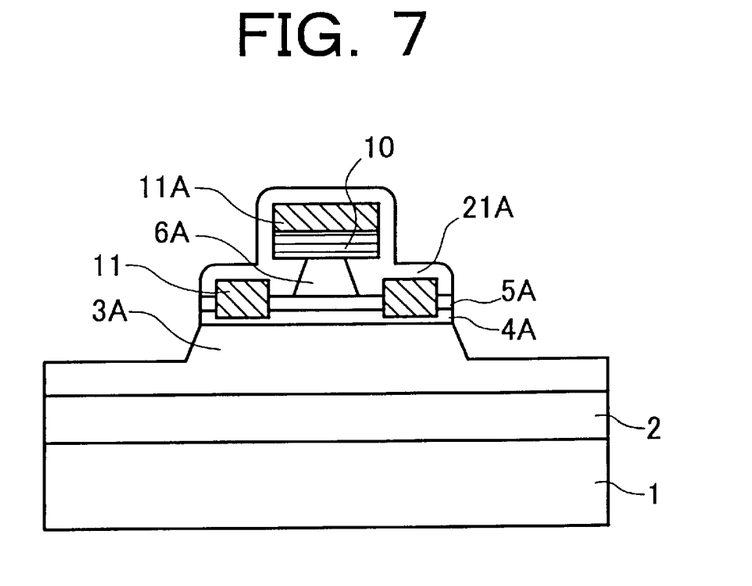
FIG. 7 is a sectional view illustrating the manufacturing method for an embodiment of a semiconductor device according to the present invention.

Then, patterning is done by photolithography and then insulating films 21 and 20A are processed by plasma etching. At this stage, the insulating film 20A is completely removed. Next, the n type In$_x$Ga$_{1-x}$P emitter layer 5 is etched with hydrochloric acid, and the p type GaAs base layer 4 and n type GaAs collector layer 4 are etched with phosphoric acid etching solution (H$_3$PO$_4$ (85 weight %): H$_2$O$_2$ (30 weight %): H$_2$O=1:2:40) to make them an emitter layer 5A, a base layer 4A, and a collector layer 3A, respectively (FIG. 7).

Figure 8:
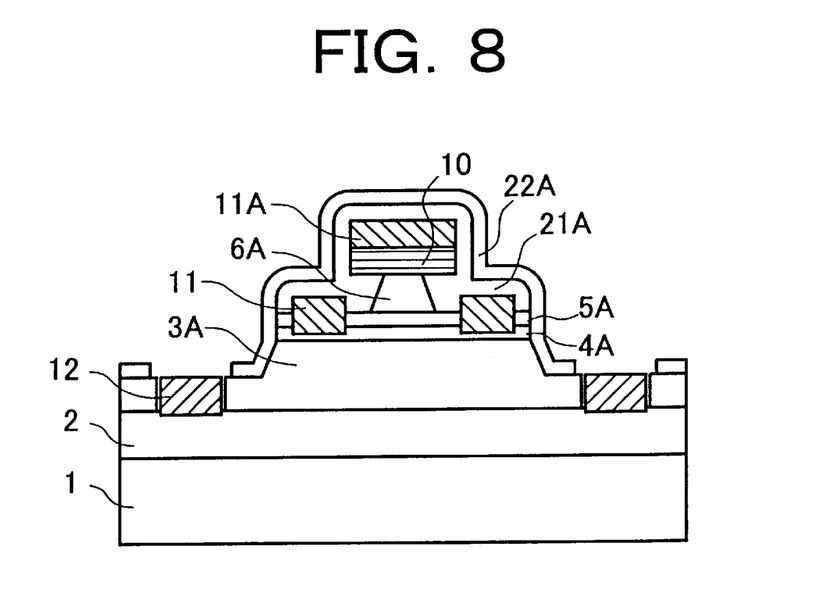
FIG. 8 is a sectional view illustrating the manufacturing method for an embodiment of a semiconductor device according to the present invention.

Next, using the thermal CVD method, the whole surface is covered with an insulating film under the following forming condition: three types of gas are used (4% SiH$_4$ diluted with N$_2$, and O$_2$ and N$_2$ whose flow rates are 500 sccm, 3,500 sccm and 2,000 sccm, respectively) atmospheric pressure; and 390° C. substrate temperature. Then, after patterning by photolithography, this insulating film is processed by plasma etching to make it 22A. Using this insulating film 22A as a mask, a channel which reaches the n type GaAs sub-collector layer 2 is formed using a phosphoric acid etching solution as mentioned above to make a collector electrode 12 by depositing AuGe (60 nm), W (10 nm), Ni (10 nm), and Au (300 nm) one upon another by evaporation in the order of mention (FIG. 8). An Ohmic contact of the collector electrode 12 with the n type GaAs sub-collector layer 2 is made by alloying at about 390° C.

Figure 9:
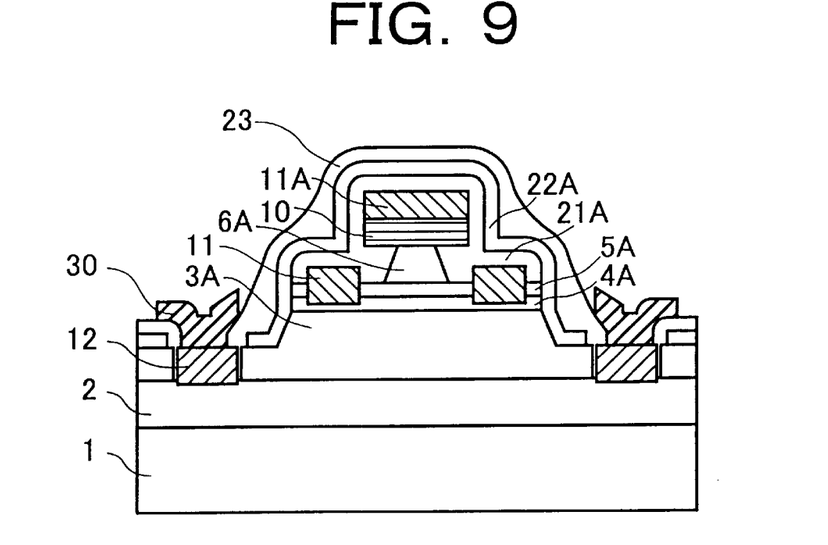
FIG. 9 is a sectional view illustrating the manufacturing method for an embodiment of a semiconductor device according to the present invention.

Then an insulating film is formed all over the surface using the plasma CVD method under the following forming condition: two types of gas, 4% SiH$_4$ diluted with N$_2$ and N$_2$O whose flow rates are 450 sccm and 200 sccm, respectively, are used; degree of vacuum 49 Pa; substrate temperature 250° C.; and supply energy RF power 150W, then to smoothen the surface to prevent such defects as discontinuity and short-circuits, rotary coating with SOG is done. Further, using the plasma CVD method (forming condition: two types of gas, 4%SiH$_4$ diluted with N$_2$ and N$_2$O whose flow rates are 450 sccm and 200 sccm respectively, are used; degree of vacuum 49 Pa; substrate temperature 250° C.; and supply energy RF power 150W), an insulating film is formed all over the surface to make an insulating film 23 which contains SOG; then an opening is made by plasma etching; Mo (50 nm) and Au (800 nm) are deposited on it by evaporation in the order of mention before a collector wiring 30 and a base wiring (not shown in the figure) are made by photolithography (FIG. 9).

Then, an insulating film is formed all over the surface using the plasma CVD method (forming condition: two types of gas, 4%SiH$_4$ diluted with N$_2$ and N$_2$O whose flow rates are 450 sccm and 200 sccm respectively are used; degree of vacuum 49 Pa; substrate temperature 250° C.; and supply energy RF power 150W), then, rotary coating of the whole film surface with SOG is done to smoothen the surface to prevent such defects as discontinuity and short-circuits. Further, using the plasma CVD method (forming condition: two types of gas, 4%SiH$_4$ diluted with N$_2$ and N$_2$O whose flow rates are 450 sccm and 200 sccm respectively, are used; degree of vacuum 49 Pa; substrate temperature 250° C.; and supply energy RF power 150W), an insulating film is formed all over the surface to make an insulating film 24 which contains SOG; then an opening is made by plasma etching; Mo (50 nm) and Au (800 nm) are deposited on it by evaporation in the order of mention before an emitter wiring 31 is made by photolithography to complete a semiconductor device as shown in FIG. 10.

Embodiment 2

FIG. 12 is a circuit diagram for a power amplifier based on a semiconductor device according to the present invention. In the figure, reference numerals 100, 101 and 102 represent HBTs connected in parallel which each uses a semiconductor device according to the present invention. 110, 111, 112 and 113 represent matching networks, 120 a signal input terminal, 125 a signal output terminal, 141, 142, 143, 144, 145 and 146 represent choke inductors, 150 a collector wiring, and 160 a base wiring.

The circuit shown in FIG. 12 is the same as that for the power amplifier whose amplification factor has decreased due to high power operation as mentioned earlier except that HBTs 100, 101 and 102 each uses a semiconductor device according to the present invention. Therefore, in this circuit, the phenomenon of an amplification factor decrease caused by high power operation was not observed. This demonstrates that according to the present invention, in a power amplifier, performance deterioration can be prevented and thus high performance can be ensured.

What is claimed is:

1. A semiconductor device comprising a bipolar transistor having an emitter layer consisting of a semiconductor containing indium, and a protective insulating film containing silicon and oxygen which is formed on a surface of a guard ring of the emitter layer such that a reverse current between the emitter layer and a base is substantially $10^{-3}$ A/cm$^2$.

2. The semiconductor device as defined in claim 1, wherein the protective insulating film further contains nitrogen.

3. The semiconductor device as defined in claim 2, wherein the protective insulating film further contains hydrogen.

4. The semiconductor as defined in claim 1, wherein the bipolar transistor is formed on a semi-insulating compound semiconductor substrate and is a hetero junction bipolar transistor.

5. The semiconductor as defined in claim 4, wherein the emitter layer is an n-type InxGa1-xP layer (0<x<1), and the hetero junction bipolar transistor further has a sub-collector layer which is an n-type GaAs layer, a collector layer which is an n-type GaAs layer, a base layer which is a p-type GaAs layer, and an emitter contact layer which is an n-type InyGa1-yAs layer (0<y<1).

6. A power amplifier comprising a plurality of semiconductor devices on input and output sides, wherein at least one of the semiconductor devices located nearest to the output side is a semiconductor device comprising a bipolar transistor, said bipolar transistor has an emitter layer consisting of a semiconductor containing indium, and a protective insulating film containing silicon and oxygen which is formed on a surface of a guard ring of the emitter layer, wherein a reverse current between the emitter and the base is $10^{-3}$ A/cm$^2$ or more and less than $10^{-3}$ A/cm$^2$.

* * * * *